United States Patent
Ogashiwa et al.

(10) Patent No.: US 6,187,114 B1
(45) Date of Patent: *Feb. 13, 2001

(54) SOLDER MATERIAL AND ELECTRONIC PART USING THE SAME

(75) Inventors: Toshinori Ogashiwa; Takatoshi Arikawa, both of Tokyo; Masami Yokozawa, Kyoto; Kazuhiro Aoi, Nara; Yoshiharu Sawada, Osaka, all of (JP)

(73) Assignees: Matsushita Electric Industrial Co. Ltd., Osaka; Tanaka Denshi Kogyo K.K., Tokyo, both of (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/950,284

(22) Filed: Oct. 14, 1997

(30) Foreign Application Priority Data

Oct. 17, 1996 (JP) .................................. 8-275087

(51) Int. Cl.[7] .................................. B22K 35/26
(52) U.S. Cl. .................. 148/400; 420/557; 420/560; 420/561; 420/562; 228/56.3; 148/22
(58) Field of Search ............ 148/400, 22; 420/557, 420/560–562; 228/56.3

(56) References Cited

U.S. PATENT DOCUMENTS

| | | | |
|---|---|---|---|
| 3,457,067 | 7/1969 | Allen | 420/557 |
| 5,366,692 | 11/1994 | Ogashiwa | 420/565 |
| 5,393,489 | 2/1995 | Gonya et al. | 420/561 |
| 5,411,703 | 5/1995 | Gonya et al. | 420/561 |
| 5,550,407 | 8/1996 | Ogashiwa | 257/737 |

FOREIGN PATENT DOCUMENTS

| | | |
|---|---|---|
| 1 255 455 | 11/1967 | (DE) . |
| 0 638 656 | 2/1995 | (EP) . |
| 61-055774 | 3/1986 | (JP) . |
| 61-156823 | 7/1986 | (JP) . |
| 62-163335 | 7/1987 | (JP) . |
| 62-197292 * | 8/1987 | (JP) . |
| 2-092491 | 4/1990 | (JP) . |
| 4-307944 | 10/1992 | (JP) . |
| 6-000685 | 1/1994 | (JP) . |
| 6-269981 | 9/1994 | (JP) . |
| 6-269983 | 9/1994 | (JP) . |
| 08125080 * | 5/1996 | (JP) . |
| 8-164496 | 6/1996 | (JP) . |
| 8-206874 | 8/1996 | (JP) . |
| 8-215880 | 8/1996 | (JP) . |
| WO 92/17617 | 10/1992 | (WO) . |

OTHER PUBLICATIONS

Chemical Abstracts, vol. 114, No. 24; Abstract No. 233324, Khorunov, V.F. et al: "Tin alloys for soldering of nickel", Jun. 1991.

Communication from European Patent Office and attached Search Report, Feb. 1998.

* cited by examiner

*Primary Examiner*—Sikyin Ip
(74) *Attorney, Agent, or Firm*—Merchant & Gould P.C.

(57) ABSTRACT

This invention provides a lead-free high temperature solder material comprising 0.005–3.0 wt % of palladium (Pd) and 97.0–99.995 wt % of tin (Sn) whose liquidus temperature is 200–350° C. The solder material is environmentally-friendly, improved in thermal fatigue property, and it can improve the reliability of electronic apparatuses. A predetermined amount of Sn material and Pd is mixed, vacuum-melted and cast to prepare an ingot. The ingot is rolled to be a tape that is later pressed to obtain a solder pellet. In a preferable composition, at least 95 wt % of Sn and 0.005–3.0 wt 5 of Pd are contained, and 0.1–5.0 wt % of metallic (e.g. Cu, Ni) or alloy particles are added. The average particle diameter is about 40 μm. A substrate and an IC chip (electronic element) are die-bonded substantially in parallel by a solder material provided between an Ni plating on the lower side of an IC chip (semiconductor) and an Ni plating on a die.

26 Claims, 1 Drawing Sheet

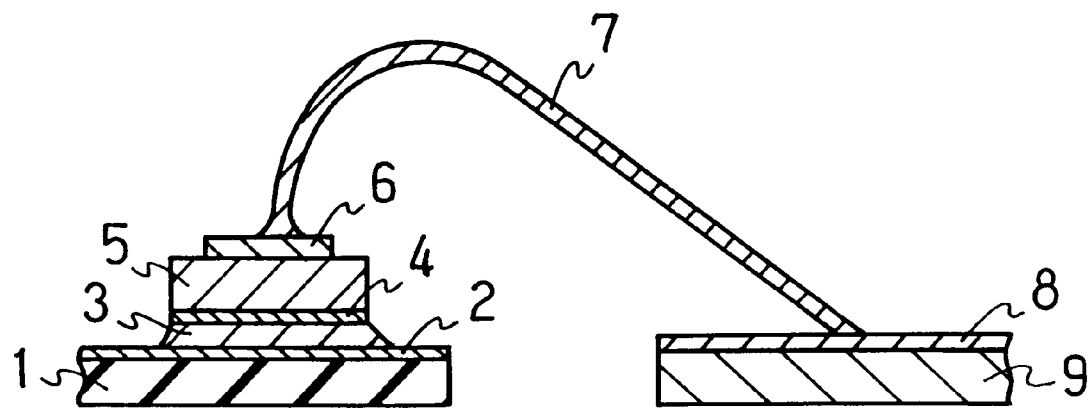
F I G. 1
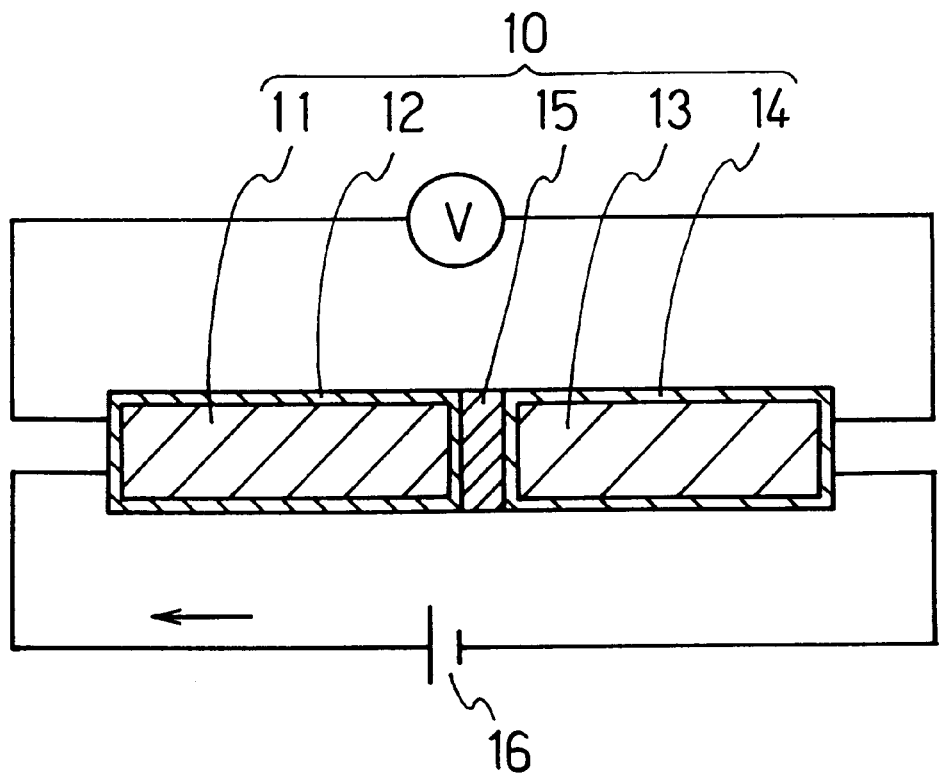
F I G. 2

SOLDER MATERIAL AND ELECTRONIC PART USING THE SAME

FIELD OF THE INVENTION

This invention relates to a lead-free high-temperature solder material that has excellent thermal fatigue properties and is environmentally-friendly. The solder material is specifically useful for die bonding electronic elements and for soldering of heat-generating parts for a hybrid IC as well as other uses. This invention also relates to electronic parts using the same.

BACKGROUND OF THE INVENTION

Lead-free solder has been much more required recently due to problems such as waste disposal of electronic devices and for protecting the environment.

On the other hand, Pb—Sn based solder is generally used for soldering electronic parts. Pb—Sn based solder has good connectability, and thus the melting point can be selected in a wide range by controlling the ratio. In such solders, 63 wt % Sn—Pb eutectic solder generally has been used since it enables soldering of electronic parts at a lower temperature with less thermal influence on the electronic parts since its melting point is only 183° C.

During a process for installing electronic parts, the soldered portion may be heated once again in an installed electronic part. For example, in a process for manufacturing a semiconductor device, the die is heated after the semiconductor element chip is soldered to a lead frame (e.g. a die) for wire-bonding. In a hybrid IC where electronic parts are installed on both surfaces of a printed circuit board, one side is provided with electronic parts and soldered after the other side is treated likewise. The electronic elements will be heated also by their own heat even after the installation.

In order to avoid the above-mentioned problems, the first soldering materials are required to have a higher liquidus temperature, so that the first-bonded parts will not fall out during a second heating. Such a high temperature soldering material should have a liquidus temperature ranging from 200 to 350° C.

Unexamined Published Japanese Patent Application No. 61-156823 discloses a lead-free high-temperature solder material whose liquidus temperature ranges from 200 to 350° C. The Sn—Cu based material mainly comprises Sn to which small amount of Cu is added. Unexamined Published Japanese Patent Application No. 61-55774 discloses Sn—In based lead-free solder material and No. 62-163335 discloses Sn—Cu—Zn based material.

Unexamined Published Japanese Patent Application No. 6-685 discloses that metallic or insulator particles are added to a material to be die-bonded by pressure-adhering in order to control the thickness of the die bond material.

However, if the conventional lead-free high temperature solder materials such as Sn—Cu are used for die-bonding or soldering of heating parts such as a hybrid IC, the high temperature solder is cracked and the conduction is worsened after the electronic device is used for a long time. This is caused by thermal fatigue due to the heat cycle. Heat cycle means repeated temperature change, for example the inside of an electronic device being heated by its electronic parts when used, and the temperature returning to room temperature after that. As previously known, the conventional lead-free high temperature solder material is inferior in the thermal fatigue properties. Therefore, lead-containing high temperature solder has been widely used in order to improve thermal fatigue property. Some other conventional lead-free high temperature soldering materials are not good in soldering properties.

SUMMARY OF THE INVENTION

In order to solve these and other problems of the prior art, this invention aims to provide a lead-free high temperature solder material and an electronic part using the same. The composition of the solder material is substantially lead-free, and its liquidus temperature is from 200 to 350° C. The thermal fatigue property of the solder material is improved and the reliability of the electronic parts is raised. The solder material is environmentally-friendly.

Another object of this invention is to solve the problem of partial distribution of composition and reduce the graded junction caused by the difference in specific gravity of the elements in the solder material composition, so that problems such as increased heat resistance and deteriorated reliability can be avoided when electric parts and substrates are die-bonded via solder materials.

In order to achieve such aims, a first solder material of this invention comprises 0.005–3.0 wt % of palladium (Pd) and 97.0–99.995 wt % of tin (Sn), and its liquidus temperature ranges from 200 to 350° C.

A second solder material of this invention comprises 0.005–3.0 wt % of at least one of palladium and germanium (Ge), the total amount of which is at most 5.0 wt %, and the solder material comprises 95.0–99.995 wt % of tin.

The first solder material preferably contains 0.005–2.0 wt % of at least one element selected from the group consisting of Ag, Ge, P, Zn, Cu, B, Sb, Bi, and In in place of a portion of Pd and/or Sn.

The second solder material preferably contains 0.005–2.0 wt % of at least one element selected from the group consisting of Ag, P, Zn, Cu, B, Sb, Bi, and In in place of a portion of at least one element selected from the group consisting of Pd, Sn and Ge.

It is also preferable that the first solder material contains 0.001–5.0 wt % of metallic or alloy particles in place of a portion of Pd and/or Sn.

It is also preferable that the second solder material contains 0.001–5.0 wt % of metallic or alloy particles in place of a portion of at least one element selected from the group consisting of Pd, Sn and Ge.

It is further preferable that the specific gravity of the metallic or alloy particles is within plus or minus 2 of the specific gravity of Sn (7.28).

It is preferable that the metallic or alloy particles are selected from the group consisting of oxides, carbides, nitrides, alloys and metals that are selected from the group consisting of Cu, Ni and Fe.

It is preferable that the average particle diameter of the metallic or alloy particles ranges from 5 to 100 μm.

It is preferable that the average particle diameter ranges from 20 to 60 μm.

It is preferable that the melting point of the metallic or alloy particles is at least 400° C.

It is preferable that the purity of Sn in the material is at least 99.9 wt %.

It is preferable that the material is substantially lead-free, namely, the amount of lead is reduced to a trace as an inevitable impurity.

A first electronic part of this invention is formed by bonding a substrate and an electronic element, by using a solder material that comprises 0.005–3.0 wt % of palladium and 97.0–99.995 wt % of tin. The liquidus temperature of the solder material is from 200 to 350° C.

A second electronic part of this invention is formed by bonding a substrate and an electronic element by using a solder material that comprises 0.005–3.0 wt % of palladium and/or germanium, the total amount of which is at most 5.0 wt %, and the material comprises 95.0–99.995 wt % of tin.

It is preferable that the first electronic part contains 0.005–2.0 wt % of at least one element selected from the group consisting of Ag, Ge, P, Zn, Cu, B, Sb, Bi, and In in place of a portion of Pd and/or Sn.

It is preferable that the second electronic part contains 0.005–2.0 wt % of at least one element selected from the group consisting of Ag, P, Zn, Cu, B, Sb, Bi, and In in place of a portion of at least one element selected from the group consisting of Pd, Sn and Ge.

It is also preferable in the first electronic part that the first and second electronic parts materials contain 0.001–5.0 wt % of metallic or alloy particles in place of a portion of Pd and/or Sn.

It is also preferable in the second electronic part that the first and second electronic parts materials contain 0.001–5.0 wt % of metallic or alloy particles in place of a portion of at least one element selected from the group consisting of Pd, Sn and Ge.

It is further preferable in the first and second electronic parts that the specific gravity of the metallic or alloy particles is within plus or minus 2 of the specific gravity (7.28) of Sn.

It is preferable in the second electronic parts that the average particle diameter of the metallic or alloy particles ranges from 20 to 60 μm.

A third electronic part of this invention is formed by die-bonding the electronic elements by using solder material comprising palladium of 0.5–2.0 wt % to tin, and the liquidus temperature of the solder material is 320° C. or less.

It is preferable in the third electronic part that the solder material comprises metallic particles whose specific gravity within plus or minus 2 of the specific gravity of Sn (7.28), and the electronic part is arranged on the melt-dropped solder material.

It is preferable in the third electronic part that the solder material is provided between the electronic element surface and a substrate surface on which Ni-based films are formed and that the substrate and the electronic part are bonded to each other by the solder material sandwiched by the Ni-based films.

It is preferable in the first to third electronic parts of this invention that the solder material is substantially lead-free, namely, the lead in the solder material is reduced to a trace as an inevitable impurity.

The preferable composition of this invention is based on a lead-free solder material containing a large quantity of tin (at least 95.0 wt %). Palladium (0.005–3.0 wt %) and some other elements compose the rest of the material. The solder material is a high temperature lead-free solder material whose liquidus temperature ranges from 200 to 350° C. It is preferable that 0.005–2.0 wt % of at least one element selected from the group consisting of Ag, Ge, P, Zn, Cu, B, Sb, Bi and In is contained.

It is also preferable that the electronic part is formed by providing a lead-free high temperature solder material between an electronic part and a substrate arranged substantially in parallel, and the solder material comprises 0.1–5.0 wt % of metallic or alloy particles of about 40 μm whose specific gravity is substantially equal to Sn.

It is also preferable that at least one of the electronic part and substrate is made of materials being easily broken or damaged, and Ni films are formed on the surfaces to sandwich the lead-free high temperature solder material in order to bond the electronic part and the substrate. The material is, for example, a CC (computer and communication) complex, GaAs, and ceramics.

A preferable lead-free high temperature solder material of this invention comprises 0.005–3.0 wt % of palladium, 95.0–99.985 wt % of tin and some other elements. Its liquidus temperature ranges from 200 to 350° C., and thus, its thermal fatigue property is good.

The lead-free high temperature solder material comprises 0.005–2.0 wt % of at least one element selected from the group consisting of Ag, Ge, P, Zn, Cu, B, Sb, Bi, and In. An oxide will deteriorate solder property. In this invention where Sn is the main component, the problem can be solved if any component whose average energy for forming oxides is greater that that of Sn can be added. The additives are preferably environmentally-friendly. Among them, Ge, Cu, Ag and B are further preferable.

The electronic part of the invention is formed by providing a lead-free high temperature solder material between the electronic element and the substrate that are arranged substantially in parallel for die-bonding. The lead-free high temperature solder material comprises 0.005–3.0 wt % of palladium and 95.0–99.985 wt % of tin and its liquidus temperature ranges from 200 to 350° C. The solder material comprises 0.1–5.0 wt % of metallic or alloy particles of about 401 μm whose specific gravity is substantially equal to the Sn. The electronic part has a good thermal fatigue property, and a graded junction can be prevented since the electronic element is installed in parallel to the substrate without solder nonuniformity.

BRIEF DESCRIPTION OF THE DRAWINGS

FIG. 1 is a cross sectional view to show an electronic part in the first embodiment of this invention.

FIG. 2 is a schematic view to show a specimen and a method for measuring the same in the Example of this invention.

DETAILED DESCRIPTION OF THE INVENTION

Some embodiments of this invention are described below.

A lead-free high temperature solder element of the first embodiment has the following composition.

Sn material for this invention is preferably a highly purified Sn of at least 99.9 wt %, more preferably, at least 99.99 wt %. As the Sn material becomes purer, Pb contamination in the inevitable impurities can be prevented.

In this invention, the term "lead-free" indicates that the amount of included lead is reduced to be an environmentally-friendly level. It is preferable that the lead is reduced to a trace as an inevitable impurity.

This invention can improve thermal fatigue property by using a synergistic effect of coexistence of a predetermined amount of Pd and Sn.

When the Sn amount is at least 95.0 wt % in a Pb-free Sn—Pd alloy solder, the thermal fatigue property can be further improved compared to a case where Sn is less than 95.0 wt %. Therefore, it is preferable that at least 95.0 wt % of Sn is contained. When the Sn amount is at least 95.49 wt %, the thermal fatigue property is further improved. So the preferable Sn amount is at least 95.49 wt %.

If the Sn amount exceeds 99.985 wt % in a Pb-free Sn—Pd solder, the required Pd cannot be contained in the alloy. Therefore, the preferable Sn amount is not more than 99.985 wt %. When the Sn amount is 99.94 wt % or less, Pd, namely, a useful coexisting element can be contained in an amount of 0.05 wt % or more. As a result, its thermal fatigue property is further improved. Therefore, the preferable Sn amount is 99.94 wt % or less.

In conclusion, the preferable Sn range is 95.0–99.985 wt %, more preferably, 95.0–99.94 wt %. The most preferable range is 95.49–99.94 wt %.

When the Pd amount in a Pb-free Sn—Pd alloy solder is at least 0.005 wt %, the thermal fatigue property can be extremely improved compared to a case where Pd is less than 0.005 wt %. Therefore, at least 0.005 wt % of Pd should be contained. When the Pd amount is at least 0.05 wt %, the thermal fatigue property is much improved. So, the preferable Pd amount is at least 0.05 wt %.

On the other hand, if more than 3.0 wt % of Pd is contained in a Pb-free Sn—Pd alloy solder, the thermal fatigue property deteriorates compared to a case where the Pd amount is 3.0 wt % or less. Therefore, Pd should be controlled not to exceed 3.0 wt %. When Pd is 2.5 wt % or less, the thermal fatigue property is further improved. So the preferable Pd amount is 2.5 wt % or less.

As a result, the Pd range is determined to be from 0.005–3.0 wt %. The preferable amount is 0.05–3.0 wt %, more preferably, 0.05–2.5 wt %.

As long as the predetermined amount of Pd and Sn coexist, the effects of this invention can be maintained even if any other elements are added. This is true when at least one of other elements is added in the range of 0.005–2.0 wt %. The element is selected from the group consisting of Ag, Ge, P, Zn, Cu, B, Sb, Bi, and In. Ag, Ge, Cu and B are particularly preferred to obtain environmentally-friendly solder materials.

The liquidus temperature of the lead-free high temperature solder material of this invention is required to be from 200 to 350° C. When the liquidus temperature is less than 200° C., the temperature for the second heating should be less than 200° C., and thus, the temperature condition for the second heating will be limited. So the liquidus temperature should be at least 200° C. The liquidus temperature should be kept to 350° C. or less to prevent influences on the electronic parts such as heat distortion.

The lead-free high temperature solder material of this invention can be processed to be tapes or wires, or it can be used for immersion baths and vapor deposition. This material can be used as a complex material by mixing particles having high melting point. The material is processed to be tapes of predetermined dimension by casting in an ingot, rolling and then slitter-treating. For providing a wire of a predetermined dimension, a raw wire is made by either extruding an ingot or eject-quenching the melted material into water, and then by drawing the wire.

The lead-free high temperature solder material of this invention is heated again after the first soldering. And it is effectively used for the first soldering material when it is subjected to heat cycles between high and low temperatures. The examples are die-bonding and hybrid IC installment. The examples are explained below.

FIG. 1 is a side view of a soldering device before resin sealing. An Ni plating 2 is provided on the surface of a die 1 of a lead frame as a substrate. An Al electrode 6 is formed on the upper surface of an IC chip 5 that is an electronic element and also a semiconductor element, and an Ni plating 4 (metallizing layer) is formed on the lower surface of the same chip 5. A gold wire 7 is wire-bonded to the Al electrode 6 on the upper surface. The wire 7 electrically bonds the semiconductor element to the lead. The other end of the wire 7 is bonded to the upper surface of the inner lead 9 that is provided with an Ni plating 8. The substrate and the semicondutor IC chip 5 (electronic element) are die-bonded substantially in parallel through the lead-free high temperature solder material 3 between the Ni plating 4 on the lower surface of the IC chip 5 and the Ni plating 2 on the die 1.

For manufacturing the solder device, the IC chip 5 is mounted on the upper surface of the die 1 through a solder pellet formed in a circular or rectangular shape. The device is soldered by a first heat by passing through a hydrogen atmosphere furnace. After that, the device is heated again at the temperature from 150 to 250° C. from the bottom of the die 1 so that the gold wire 7 is bonded to the Al electrode 6 by heat and pressure.

In a hybrid IC, an IC chip (not shown) is mounted on one surface of a printed circuit board to carry out a first soldering by using the lead-free high temperature soldering material of this invention. A second soldering is carried out by using another solder material with lower liquidus temperature in order to mount an electronic part on the other side of the printed circuit board. As a result, a small electronic apparatus will be provided.

In the following example, a silicon semiconductor element is used for the electronic element. After adding 1 wt % of Pd to Sn, the mixture was melt-agitated at 320° C. and rolled so that a lead-free high temperature solder material was prepared as a sheet 4 mm wide and 100 μm thick. Then, the sheet was installed on a TO-220 package lead frame that is Ni-plated, and a semiconductor element (silicon chip) was arranged to be die-bonded at 270° C. An Ni film was previously adhered on the backside of the silicon chip that was 2.3 mm square.

The Pd amount was varied to obtain the best range for a silicon semiconductor chip. As a result, the semiconductor device can be prevented from cracking when at least 0.5 wt % of Pd was contained. The Pd was determined to be 2.0 wt % or less to control the die bond temperature at 320° C. or less, so that the die bond device has durability and oxidation of the die bond material will be prevented.

The thickness of the solder is controlled as follows.

Respectively 1 wt % of Pd and Ge plus 0.3 wt % of Ni (specific gravity: 8.8) were added to Sn (specific gravity: 7.28), and the mixture was melt-agitated at 300° C. The mixture was taken out from the bottom of the melting container drop by drop, dropped on the portion for mounting a semiconductor device of TO-220 package lead frame, and a silicon chip was die-bonded thereon. A semiconductor device was obtained by wiring Al wire, resin-sealing and lead processing. As a result, a product without graded junction was provided in this dropping method called potting.

High melting point particles are added to the lead-free high temperature solder material of this invention in order to keep the solder horizontal when the semiconductor device is die-bonded. The melting point of the particles is preferably 400° C. or higher, the amount is preferably 0.001–5.0 wt % (more preferably, 0.001–0.6 wt %), and the particle diameter is preferably 5–100 μm. Oxides, carbides and metal particles such as Cu and Ni are preferred for the high melting point particles.

When a semiconductor element (electronic element) and a substrate are bonded, the solder thickness between them should be controlled in the range from 30 to 60 μm. For this purpose, the particle diameter should be 40 μm±20 μm, and the difference of the specific gravity to that of Sn is preferably 2 at most. When the difference is bigger than 2, the particle will float or sink in the solder, which causes adhesiveness deterioration, and decreases reliability. Ni, Cu (specific gravity: 8.9) and Fe (specific gravity: 7.9) are specifically preferred, since the difference of specific gravity is within 2 and they are heavier than Sn. No oxides or carbides provide particles of such specific gravity.

It is preferable that the average particle diameter is 40 μm±20 μm. If the number of particles with a diameter of approximately 10 μm increases, the chip will be broken or cracked. Too thick particles will increase heat resistance. This is specifically true when brittle and fragile materials such as silicon, GaAs and ceramics are used for the electronic element and/or substrate. The solder is also required to maintain a predetermined range of thickness.

The particle diameter should be 40 μm±20 μm, and the difference of specific gravity of the metal particles to that of Sn is preferably 2 at most, since electric conductivity and heat radiation characteristics to the semiconductor are improved.

In this invention, brittle and fragile materials such as silicon, GaAs, and ceramics are used for the electronic element and/or the substrate. The surfaces are plated with Ni-based plating films such as Ni films and Ni alloy films. The plating films are used for sandwiching the lead-free high temperature solder material of this invention to adhere the electronic element and substrate, which increases adhesiveness and exceedingly improves the thermal fatigue property and the heat radiation property. A better effect can be obtained when the particle diameter is 40 μm±20 μm and the difference of specific gravity to that of Sn is preferably 2 at most depending on the alloy of the Ni films and the metal particles, or the bonding performance. As a result, heat resistance will be improved.

For the copper materials, Ni-plated lead frames and semiconductor elements Cr/Cr+Ni/Ag (0.3 μm) and others can be used. In a case of die-bonding materials for power semiconductor devices, heat generated inside the element should be radiated outward as well as conducting electricity. In such a case, the difference in thermal conductivity and thermal distortion occurring between various parts will be relaxed.

In this invention, the solder material can comprise 0.005–3.0 wt % of palladium, and the rest is composed of tin and the inevitable impurities.

In the following Examples, the total amount of the solder composition is not always 100% (Tables 1 and 2), since a trace of inevitable impurities are contained. The amount of the inevitable impurities are calculated by subtracting the total wt % of the solder materials from 100%.

EXAMPLE 1

FIG. 2 is a schematic view to show specimens and a method for measuring the same.

A predetermined amount of Pd and Sn materials of 99.99 wt % purity were mixed and melted under vacuum. The total amount should be 100 wt % if inevitable impurities are counted. The mixture was forged to obtain an ingot having the composition shown in Table 1. The ingot was rolled to be a tape 0.1 mm thick and 10.0 mm wide. The tape was further pressed to obtain a solder pellet 0.1 mm thick and 1.8 mm in diameter. A specimen 10 was prepared by soldering two materials of different coefficients of thermal expansion, using the above solder pellet A, in order to carry out a thermal fatigue test A.

The materials for the specimen A were Cu (coefficient of thermal expansion: $17.5 \times 10^{-6}$/° C.) and 42 alloy ($4.4 \times 10^{-6}$/° C.). The 42 alloy means 42 wt % of Ni—Fe. The solder pellet was sandwiched between a copper bar with an Ni plating (9 μm thick) and a 42 alloy bar. The copper bar was 1.8 mm in diameter and 20 mm long. Then the bars were soldered in an argon gas flow at 350° C. More specifically, the copper bar 11 with Ni plating 12 and the 42 alloy bar 13 with Ni plating 14 were bonded via the solder material 15. In this process, inorganic acid water soluble flux (IA200L made by JAPAN ALPHA METALS) was used. In the thermal fatigue test A, a gaseous phase heat shock test device (ES 50 L by Hitachi Ltd.) was used. The test was conducted by repeating the following cycle until a predetermined thermal fatigue was obtained.

One cycle=(−55° C.×15 min.)+(Room temperature×5 min.)+(150° C.×15 min.)+(Room temperature+5 min.)

The thermal fatigue was measured by checking cracks on the solder in the method shown in FIG. 2 after a predetermined number of cycles of the thermal fatigue test. A predetermined range of voltage by a power source 16 was applied to the both ends of the specimen, so that the voltage at the both ends was measured at a regular current. When the voltage at the both ends increased over 10% by the initial value (the value before the test A), the defect was decided to be caused by cracks. The number of cycles up to the defective point was calculated by extrapolation of the measured value. The result is shown in Table. 1.

EXAMPLES 2–25

Comparative Examples 1–5

Another thermal fatigue test A was conducted by preparing specimens from a solder pellet in the same way as Example 1 except that the ingot composition was varied as shown in Table 1. The result is shown in Tables 1 and 2.

TABLE 1

| | Composition (wt %) | | | | | | | | | | | Liquidus Temperature | Thermal Fatigue Test Cycle Number up to |
|---|---|---|---|---|---|---|---|---|---|---|---|---|---|
| Ex. | Pd | Ag | Ge | P | Zn | Cu | B | Sb | Bi | In | Sn | (° C.) | Defective Point |
| 1 | 0.005 | — | — | — | — | — | — | — | — | — | 99.985 | 200 to 350 | 550 |
| 2 | 0.05 | — | — | — | — | — | — | — | — | — | 99.94 | 200 to 350 | 820 |
| 3 | 1.0 | — | — | — | — | — | — | — | — | — | 98.99 | 200 to 350 | 1010 |
| 4 | 2.5 | — | — | — | — | — | — | — | — | — | 97.49 | 200 to 350 | 810 |

TABLE 1-continued

| | Composition (wt %) | | | | | | | | | | Liquidus Temperature | Thermal Fatigue Test Cycle Number up to |
|---|---|---|---|---|---|---|---|---|---|---|---|---|
| Ex. | Pd | Ag | Ge | P | Zn | Cu | B | Sb | Bi | In | Sn | (° C.) | Defective Point |
| 5 | 3.0 | — | — | — | — | — | — | — | — | — | 96.99 | 200 to 350 | 660 |
| 6 | 1.0 | 0.005 | — | — | — | — | — | — | — | — | 98.985 | 200 to 350 | 1010 |
| 7 | 1.0 | 0.3 | — | — | — | — | — | — | — | — | 98.69 | 200 to 350 | 1020 |
| 8 | 1.0 | 1.0 | — | — | — | — | — | — | — | — | 97.99 | 200 to 350 | 1000 |
| 9 | 0.005 | 1.0 | — | — | — | — | — | — | — | — | 98.985 | 200 to 350 | 540 |
| 10 | 0.05 | 1.0 | — | — | — | — | — | — | — | — | 98.94 | 200 to 350 | 830 |
| 11 | 2.5 | 1.0 | — | — | — | — | — | — | — | — | 96.49 | 200 to 350 | 810 |
| 12 | 3.0 | 1.0 | — | — | — | — | — | — | — | — | 95.99 | 200 to 350 | 650 |
| 13 | 2.5 | 2.0 | — | — | — | — | — | — | — | — | 95.49 | 200 to 350 | 800 |
| 14 | 1.0 | — | 0.3 | — | — | — | — | — | — | — | 98.69 | 200 to 350 | 1010 |
| 15 | 1.0 | — | — | 0.3 | — | — | — | — | — | — | 98.69 | 200 to 350 | 1000 |
| 16 | 1.0 | — | — | — | 0.3 | — | — | — | — | — | 98.69 | 200 to 350 | 1010 |
| 17 | 1.0 | — | — | — | — | 0.3 | — | — | — | — | 98.69 | 200 to 350 | 1010 |
| 18 | 1.0 | — | — | — | — | — | 0.3 | — | — | — | 98.69 | 200 to 350 | 1000 |
| 19 | 1.0 | — | — | — | — | — | — | 0.3 | — | — | 98.69 | 200 to 350 | 1020 |
| 20 | 1.0 | — | — | — | — | — | — | — | 0.3 | — | 98.69 | 200 to 350 | 1000 |
| 21 | 1.0 | — | — | — | — | — | — | — | — | 0.3 | 98.69 | 200 to 350 | 1010 |
| 22 | 1.0 | — | 0.1 | 0.1 | — | — | — | — | — | — | 98.79 | 200 to 350 | 1010 |
| 23 | 1.0 | — | 0.1 | — | 0.1 | 0.1 | — | — | — | — | 98.69 | 200 to 350 | 1020 |
| 24 | 1.0 | — | 0.1 | 0.1 | 0.1 | 0.1 | 0.1 | 0.1 | 0.1 | 0.1 | 98.19 | 200 to 350 | 1010 |
| 25 | 2.5 | 2.0 | — | — | — | 0.4 | — | — | — | — | 95.09 | 200 to 350 | 710 |

TABLE 2

| Com. Ex. | Composition (wt %) | | | | | | | | | | | Liquidus Temperature | Thermal Fatigue Test Cycle Number up to |
|---|---|---|---|---|---|---|---|---|---|---|---|---|---|
| | Pd | Ag | Cu | Au | | | | | | | Sn | (° C.) | Defective Point |
| 1 | — | — | — | — | — | — | — | — | — | — | 99.99 | 200 to 350 | 230 |
| 2 | 10.0 | — | — | — | — | — | — | — | — | — | 89.99 | >350 | 310 |
| 3 | 1.0 | 5.0 | 3.9 | — | — | — | — | — | — | — | 90.09 | >350 | 290 |
| 4 | 0.1 | — | — | 9.8 | — | — | — | — | — | — | 90.09 | 200 to 350 | 290 |
| 5 | — | — | 0.7 | — | — | — | — | — | — | — | 99.29 | 200 to 350 | 260 |

The comparative Example 1 in Tables 1 and 2 contains no Pd (the essential substance for this invention). As clearly shown in Tables 1 and 2, the characteristic of the Comparative Example 1 is inferior as the cycle number was only 230. The comparative Example 2 that contains 10 wt % of Pd (exceeding the preferable range) was also inferior since its cycle number was only 310.

Though the Comparative Examples 3 and 4 contains appropriate amount of Pd, they contain other substances in relatively large amounts and their Sn amount was less than 95.0 wt %. Their cycle numbers were also as bad as 290. The comparative Example 5 contains a predetermined amount of Sn but no Pd, while it contains Cu. Its cycle number was as bad as 260.

On the other hand, the Examples 1–5 showed excellent result in the thermal fatigue test since the cycle number to defect was 550–1010. The Example 1–5 comprise 0.005–3.0 wt % of Pd and 95.0–99.985 wt % of Sn. Among them, the cycle number was further improved as 660–1010 when the Pd was 0.05–3.0 wt % and Sn was 95.0–99.94 wt %. Furthermore, the cycle number was improved to 810–1010 when Pd was 0.05–2.5 wt % and Sn was 95.49–99.94 wt %.

The Examples 6–25 comprise at least one element of 0.005–2.0 wt % selected from the group consisting of Ag, Ge, P, Zn, Cu, B, Sb, Bi and In, other than Pd (0.005–3.0 wt %) and Sn (95.0–99.985 wt %). In the thermal fatigue test, the cycle numbers of these Examples were 540–1020, so Examples 6–25 also showed excellent effects. When the Pd amount was 0.05–3.0 wt % and Sn was 95.0–99.94 wt %, the result was better as the cycle was 710–1020. When Pd was 0.05–2.5 wt % and Sn was 95.49–99.94 wt %, the excellent effect was obtained as the cycle was 800–1010.

EXAMPLES 31–33

Comparative Examples 10–11

In the following Examples, silicon semiconductor elements (power transistor 3 mm square) were mounted on typical TO-220 packages used for power semiconductor devices by using the lead-free high temperature solder material of this invention and conventional solder materials for comparison. In Comparative Example 10, the wt % of Pb to Sn was 95:5; in Comparative Example 11, the wt % of Sn to Ag was 96.5:3.5. In Example 31, the wt % of Sn to Ge was 98.5:1.5; in Example 32, the wt % of Sn to Pd was 98.5:1.5; and in Example 33, the wt % of Sn to Pd to Ge was 97:1.5:1.5.

The comparison was made by thermal fatigue tests B and C. In the test B, the solder materials were dipped rapidly in liquid phases of −65° C. and 150° C. for 30 minutes respectively by turns. The test B is a heat shock test for a transistor, since this test can be used to check thermal fatigue of the solder caused by distortion between the parts. Test C is conducted to check the thermal fatigue of the die bond materials between the semiconductor element at the heating part and the lead frame of the radiation part. The transistor is electrically controlled (on: 1 minute, and off: 2 minutes) to raise the transistor temperature by 90° C. (from 25° C. to 115° C.) in order to apply power to the semiconductor device for self-heating. When the thermal resistance of the power transistor rose to 1.3 times of the initial value, the value was considered defective. Thirty specimens were prepared for each Example in test B, and 10 specimens for test C to check the defective number after a predetermined cycles. The result is shown in Table 3.

TABLE 3

Thermal Fatigue Tests B and C (Defective/Specimen)

| | Heat Shock Test (−55° C.↔→150° C. Liquid phase, respectively 30 min.) | | | | | Thermal fatigue test (ΔTj = 90° C. on/off = 1 min./2 min. | | | | | |
|---|---|---|---|---|---|---|---|---|---|---|---|
| | 0 c. | 500 c. | 1000 c. | 1500 c. | 2000 c. | 0 c. | 5000 c. | 10000 c. | 15000 c. | 20000 c. | 30000 c. |
| Comparative Ex. 10 (Pb/Sn = 95/5 wt %) | 0/30 | 0/30 | 1/30 | 4/30 | 7/30 | 0/10 | 0/10 | 2/10 | 4/10 | 7/10 | 9/10 |
| Comparative Ex. 11 (Sn/A = 96.5/3.5 wt %) | 0/30 | 2/30 | 6/30 | 11/30 | 18/30 | 0/10 | 0/10 | 0/10 | 3/10 | 5/10 | 7/10 |
| Ex. 31 of the Invention (Sn/Ge) | 0/30 | 0/30 | 1/30 | 4/30 | 6/30 | 0/10 | 0/10 | 0/10 | 2/10 | 4/10 | 6/10 |
| Ex. 32 of the Invention Sn/Pd | 0/30 | 0/30 | 1/30 | 3/30 | 5/30 | 0/10 | 0/10 | 0/10 | 1/10 | 3/10 | 5/10 |
| Ex. 33 of the Invention Sn/Pd/Ge | 0/30 | 0/30 | 0/30 | 2/30 | 5/30 | 0/10 | 0/10 | 0/10 | 1/10 | 2/10 | 3/10 |

"c." in the table means cycle.

It is clear from Table 3 that the Examples 31–33 were effective in both tests B and C compared to the Comparative Examples 10 and 11. The difference was particularly remarkable in the severe thermal fatigue test B. The Example 32 was better than the Example 31, and the Example 33 showed the best result among them. The above tests results show that the lead-free high temperature solder materials of this invention has improved thermal fatigue properties compared to the conventional Pb-based solder materials. The best result was obtained when the total amount of Pd—Ge was 5 wt % or less in a mixture of Sn—Pd—Ge, and Pd and/or Ge was contained in the range of from 0.05 to 3.0 wt %.

Mostly, in the present invention it is preferable that more Pd is used than Ge, since Pd is more effective for a solder material.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A solder material consisting of 0.005–3.0 wt % of palladium and 0.005–3.0 wt % of germanium, wherein a total amount of palladium and germanium is 5.0 wt % at most, with the balance being Sn and incidental impurities.

2. The solder material according to claim 1, wherein the purity of the Sn material is at least 99.9 wt %.

3. The solder material according to claim 1, wherein the amount of lead present no more than a trace as an inevitable impurity.

4. An electronic part formed by die-bonding electronic elements using the solder material according to claim 1.

5. An electronic part formed by bonding a substrate and an electronic element via the solder material according to claim 1.

6. The electronic part of claim 5, wherein the amount of lead present in the solder material is no more than a trace as an inevitable impurity.

7. A solder material consisting of:
   0.005 to 3.0 wt % of palladium and 0.005 to 3.0 wt % of germanium, wherein a total amount of palladium and germanium is 5.0 wt % at most; and
   0.005 to 2.0 wt % of an element selected from the group consisting of Ag, P, Zn, Cu, B, Sb, Bi and In;
   with a balance being Sn and incidental impurities.

8. The solder material of claim 7 wherein the Sn has a purity of at least 99.9 wt %.

9. The solder material of claim 7 wherein lead is present at no more than a trace as an inevitable impurity.

10. An electronic part formed by bonding a substrate and an electronic element via the solder material according to claim 7.

11. An electronic part formed by die-bonding electronic elements using the solder material according to claim 7.

12. A solder material consisting of:
   0.005 to 3.0 wt % of palladium and 0.005 to 3.0 wt % of germanium, wherein a total amount of palladium and germanium is 5.0 wt % at most; and
   0.001 to 5.0 wt % of metallic or alloy particles;
   with a balance being Sn and incidental impurities.

13. The solder material according to claim 12, wherein the particles have a specific gravity that is within plus or minus 2 of the specific gravity of Sn.

14. The solder material according to claim 12, wherein the particles are selected from the group consisting of oxides, carbides, nitrides, alloys and metals selected from the group consisting of Cu, Ni and Fe.

15. The solder material according to claim 12, wherein the average particle diameter ranges from 5 to 100 µm.

16. The solder material according to claim 15, wherein the average particle diameter ranges from 20 to 60 µm.

17. The solder material according to claim 12, wherein the melting point of the particles is at least 400° C.

18. The solder material of claim 12 wherein the Sn has a purity of at least 99.9 wt %.

19. The solder material of claim 12 wherein lead is present at no more than a trace as an inevitable impurity.

20. An electronic part formed by die-bonding electronic elements using the solder material according to claim 12.

21. An electronic part formed by bonding a substrate and an electronic element via the solder material according to claim 12.

22. The electronic part of claim 21, wherein the particles have a specific gravity that is within plus or minus 2 of the specific gravity of Sn.

23. The electronic part of claim 21, wherein the particles have an average diameter that ranges from 20 to 60 µm.

24. The electronic part of claim 21, which is formed by arranging an electronic element on which the solder material has been melted and dropped.

25. The electronic part of claim 21, wherein the substrate and the electronic element are bonded with each other by providing the solder material between a substrate surface where a Ni-based film is formed and a surface of the electronic element where another Ni-based film is formed in order to sandwich the solder material between the films.

26. The electronic part of claim 21, wherein the amount of lead present in the solder material is no more than a trace as an inevitable impurity.

* * * * *